United States Patent [19]

Hilliard

[11] Patent Number: 5,389,782
[45] Date of Patent: Feb. 14, 1995

[54] OPTICALLY POWERED AMPLIFIER USED BY AN ELECTROMAGNETIC FIELD SENSOR TO AMPLIFY AN ELECTRICAL SIGNAL FROM AN ANTENNA

[75] Inventor: Donald P. Hilliard, Oxnard, Calif.

[73] Assignee: The United States of America as represented by the Secretary of the Navy, Washington, D.C.

[21] Appl. No.: 242,488

[22] Filed: May 13, 1994

[51] Int. Cl.⁶ .................... H01J 5/16; G01R 31/00; H01Q 15/00
[52] U.S. Cl. .................... 250/227.17; 324/96; 343/703
[58] Field of Search ............ 250/227.17, 227.11, 250/227.21, 206.1, 206.2, 225, 250; 324/95, 96, 97; 343/703

[56] References Cited

U.S. PATENT DOCUMENTS

| | | | |
|---|---|---|---|
| 4,070,621 | 1/1978 | Bassen et al. | 324/96 |
| 5,061,404 | 10/1991 | Wu et al. | 342/502 |
| 5,210,407 | 5/1993 | Ito et al. | 250/227.11 |
| 5,225,668 | 7/1993 | Hilliard et al. | 250/206 |
| 5,243,186 | 9/1993 | Hilliard et al. | 250/227.17 |

OTHER PUBLICATIONS

Chen, "Modulators for Optical Communications," Proceedings of the IEEE, vol. 58, No. 10, Oct. 1970, pp. 1440–1457.

*Primary Examiner*—David C. Nelms
*Assistant Examiner*—John R. Lee
*Attorney, Agent, or Firm*—David Kalmbaugh; Melvin Swilka; John Forrest

[57] ABSTRACT

An electromagnetic field sensing apparatus which detects an incoming electromagnetic field and provides an RF electrical signal indicative of the strength of the field. The electromagnetic field sensing apparatus includes a metallic antenna which intercepts the incoming planar electromagnetic wave and provides an electrical signal indicative of the strength/intensity of the field. A microwave amplifier receives the electrical signal, amplifies the signal by a factor of at least 100 and then supplies the amplified signal to an electro-optic modulator. A first light source located along a first optical path transmits polarized laser light through the electro-optic modulator. The electro-optic modulator, in response to the amplified electrical signal modulates the polarized light when the metallic antenna detects the incident electromagnetic wave. A photodetector located along the first optical path detects the modulated light as it exists from the electro-optic modulator. In this manner incident planar wave electromagnetic fields are detected and measured. A second light source, located along a second optical path, transmits a monochromatic laser light beam along the second optical path to a photovoltaic cell which then provides a DC bias voltage to the microwave amplifier.

9 Claims, 2 Drawing Sheets

OPTICALLY POWERED AMPLIFIER USED BY AN ELECTROMAGNETIC FIELD SENSOR TO AMPLIFY AN ELECTRICAL SIGNAL FROM AN ANTENNA

BACKGROUND OF THE INVENTION

1. Field of the Invention

The present invention relates generally to electromagnetic field measuring devices and more particularly to an optically powered amplifier which amplifies an electrical signal from antenna and then provides the amplified signal to an electro-optic modulator.

2. Description of the Prior Art

The detection and measurement of hazardous electromagnetic radiation which poses a biological threat to humans and animals has become increasingly more important with the rapid proliferation of electronic devices such as micro-wave ovens, marine radar systems, medical apparatus and the like. It is even believed that transmission lines and other high voltage power distribution devices can cause biological damage to humans routinely exposed to intense electric fields for extended periods of time. There is thus a need for an instrument for measuring electric field intensity which is portable, easy to operate and reliable.

In the past electromagnetic field sensing apparatus have made use of a metallic antenna coupled by an electrically conductive transmission line, such as a coaxial cable, to a receiver unit to measure incident electromagnetic fields. There are several disadvantages to this type of electromagnetic field sensing including the perturbation of the electromagnetic field being measured by the metallic antenna and the transmission line and limited transmission line length (approximately ten meters for microwave frequency signals).

A second type of electromagnetic field sensing apparatus make use of the properties of electro-optic crystals to measure the intensity of an incoming electromagnetic field. For example, U.S. Pat. No. 4,070,621 to Bassen et. al. discloses a wideband, passive detector of electromagnetic fields which includes a dipole antenna electrically coupled to an electro-optic modulator with the dipole antenna converting electromagnetic fields incident on the antenna to a voltage signal which is supplied to the modulator. A light source transmits light through the modulator with the modulator modulating the light passing through the modulator. A detector then receives the modulated light and measures, for example, the amplitude, phase and frequency of the incoming electromagnetic fields. However, these electromagnetic field sensing apparatus, such as Bassen's wideband, passive detector do not have the sensitivity to measure low level electromagnetic fields.

With these and other disadvantages known to the prior art electromagnetic field sensing apparatus the present invention was conceived and one of its objects is to provide an electromagnetic field sensing apparatus for monitoring electromagnetic radiation in free space or in the near field of a radiation source in an improved manner.

It is another object of the present invention to provide a relatively simple in design, yet highly reliable electromagnetic field sensing apparatus.

It is yet another object of the invention to provide a portable electromagnetic field sensing apparatus.

Various other advantages and objects of the present invention will become apparent to those skilled in the art as a more detailed description of the invention is set forth below.

SUMMARY OF THE INVENTION

The objects of the present invention are satisfied by an electromagnetic field sensing apparatus which detects an incoming electromagnetic field and provides an RF electrical signal indicative of the strength of the field. The present invention includes a metallic antenna which intercepts the incoming planar electromagnetic wave and provides an electrical signal indicative of the strength/intensity of the field. A microwave amplifier receives the electrical signal, amplifies the signal by a factor of at least 100 and then supplies the amplified signal to an electro-optic modulator. The present invention also includes a first light source located along a first optical path for transmitting polarized laser light through the electro-optic modulator. The electro-optic modulator, in response to the amplified electrical signal modulates the polarized light passing therethrough when the metallic antenna detects the incident electromagnetic wave. A photodetector located along the first optical path detects the modulated light as it exists from the electro-optic modulator and then passes through an optical fiber to the photodetector. In this manner incident planar wave electromagnetic fields may be detected and measured without having scattered fields effect the measurement due to the use of a relatively small metallic antenna and the limiting of metallic wires/conductors which are normally attached to the antenna as in conventional electromagnetic field measurement devices. In the present invention a polarization preserving optical fiber may be used to transmit the polarized light from the source to the electro-optic modulator. In addition, a second light source, located along a second optical path, transmits a monochromatic laser light beam along the second optical path to a photovoltaic cell which then provides a DC bias voltage to the microwave amplifier.

DETAILED DESCRIPTION OF THE PREFERRED EMBODIMENT

Figure 1:
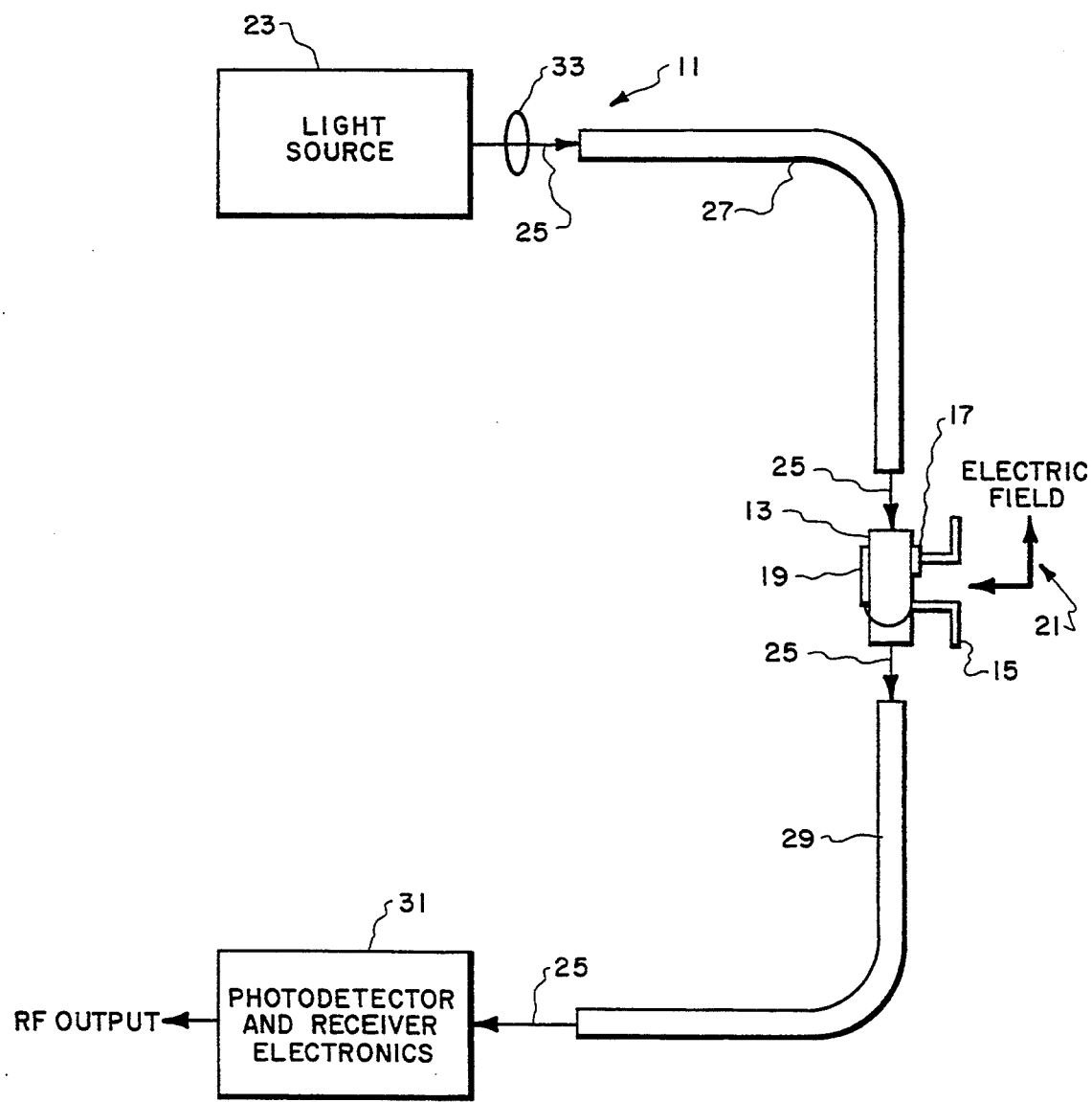
FIG. 1 is a schematic view illustrating the basic elements of a prior art electromagnetic field sensing apparatus.

Referring first to FIG. 1 there is illustrated a prior art electromagnetic field sensor apparatus, designated generally by the reference numeral 11. The electromagnetic field sensor apparatus 11 includes an electro-optic modulator 13 which is generally in the shape of a prallelepiped. A metallic antenna 15 which may be a small dipole or loop antenna is electrically connected to electro-optic modulator 13 via a pair of electrodes 17 and 19 which are attached to modulator 13. The antenna 15 converts electromagnetic fields, designated by the reference numeral 21, intercepted in free space by antenna 15 to a voltage signal which is applied to the electrodes 17 and 19 of modulator 13.

A light source 23 is located along an optical path 25 for transmitting light through a polarization maintaining optical fiber 27 to modulator 13. Modulator 13 modulates the light as it traverses modulator 13 with the voltage signal which is impressed on modulator 13 by antenna 15. The modulated light then exits electro-optic modulator 13 and is transmitted through an optical fiber 29 to a photodetector and receiver electronics module 31 which is used to measure the intensity of the electromagnetic field 21 incident on antenna 15.

Also shown in FIG. 1 is a polarizer 33 located along optical path 25 between light source 23 and electro-optic modulator 13. Polarizer 33 polarizes the light transmitted through optical fiber 27 to electro-optic modulator 13 from light source 23.

The modulation of the light in electro-optic modulator 13 is an electrically induced birefringence. The state of polarization of the light being transmitted through electro-optic modulator 13 is altered according to the electric field intensity to which the modulator 13 is subjected by the voltage signal applied to electrodes 17 and 19.

Figure 2:
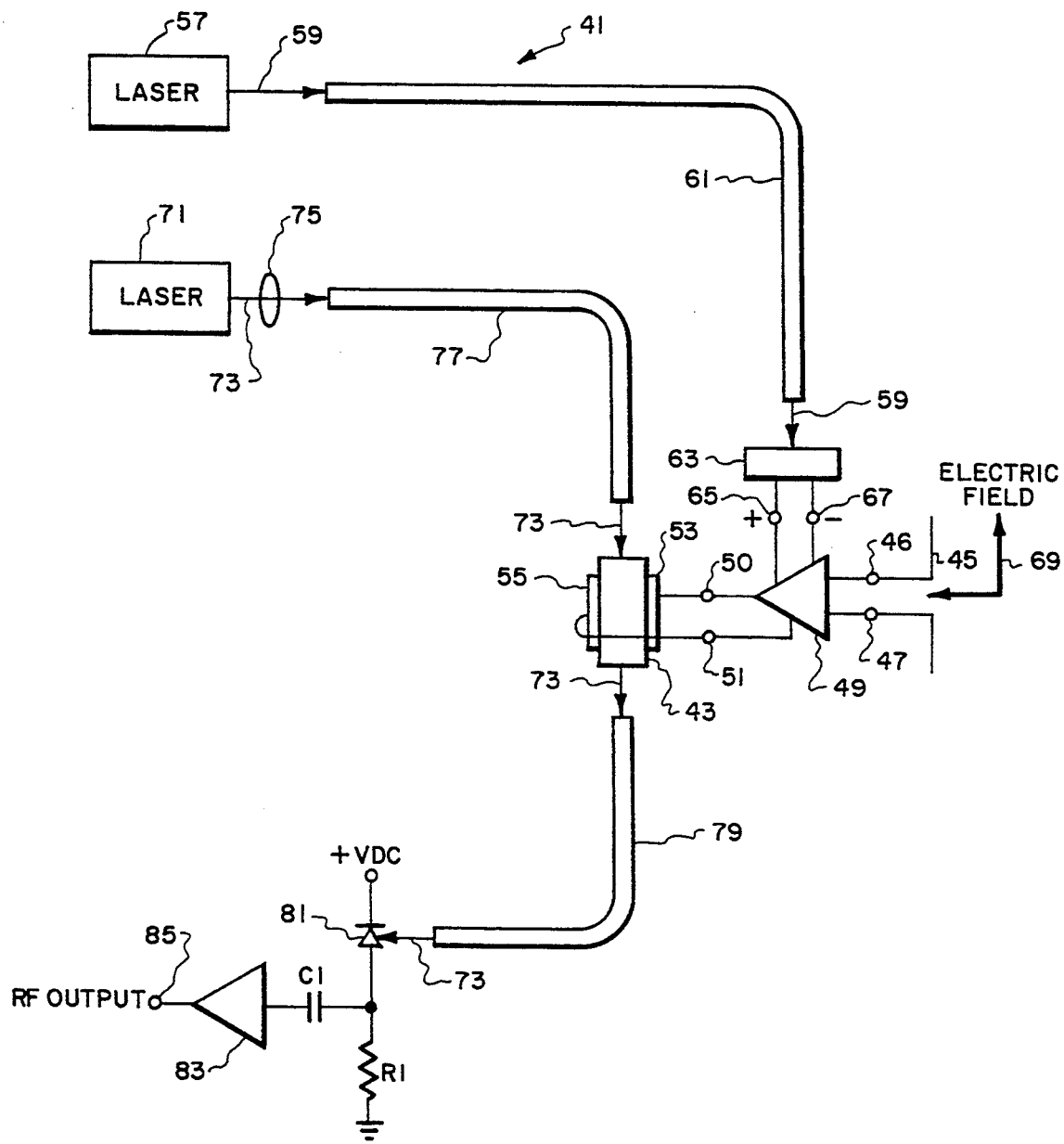
FIG. 2 is a schematic view illustrating the electromagnetic field sensing apparatus constituting the present invention.

Referring now to FIG. 2 there is shown an electromagnetic field sensor apparatus, designated generally by the reference numeral 41, which constitutes the present invention. The electromagnetic field sensor apparatus 41 includes an electro-optic modulator 43 which is generally in the shape of a prallelepiped. A metallic antenna 45 which may be a small dipole or loop antenna is electrically connected to a pair of input terminals 46 and 47 of a low noise microwave amplifier 49 which, in turn, has a pair of output terminals 50 and 51. Output terminals 50 and 51 are respectively connected to electrodes 53 and 55 of electro-optic modulator 43 thereby electrically connecting the output of microwave amplifier 49 to electro-optic modulator 43.

A laser light source 57 located along an optical path 59 transmits a monochromatic beam of laser light along path 59 through an optical fiber 61 to a photovoltaic cell 63. Photovoltaic cell 63, which is connected to a positive terminal 65 and a negative terminal 67 of microwave amplifier 49, converts the monochromatic beam of laser light from source 57 to a DC bias voltage which is supplied to amplifier 49.

Antenna 45 converts electromagnetic fields, designated generally by the reference numeral 69, intercepted in free space, to a voltage signal which is applied to terminals 46 and 47 of low noise microwave amplifier 49. Amplifier 49 then amplifies the voltage signal and then supplies the amplified voltage signal to electro-optic modulator 43 via electrodes 53 and 55.

Amplifier 49 amplifies the voltage signal provided to its input terminals 46 and 47 by a factor of between 20 and 30 Db which is an amplification factor of between 100 and 1000, that is the output signal from amplifier 49 may be 1000 times the magnitude of the input signal to amplifier 49.

At this time it should be noted that any microwave transistor such as a FET amplifier, Model A4751 by Aertech Industries of Sunnyvale, Calif. may be used as amplifier 49. It should also be noted that a Silicon Photovoltaic Cell, Model BPX 79 by Siemans Components Inc., Optoelectronics Division of Cupertino, Calif. may be used as photovoltaic cell 63.

A laser 71, located along an optical path 73, transmits a monochromatic beam of laser energy/light through a polarizer 75 which polarizes the monochromatic beam of laser energy passing through polarizer 75. The polarized beam of laser energy is then transmitted through a polarization maintaining optical fiber 77, located along optical path 73, to electro-optic modulator 43.

Electro-optic modulator 43 modulates laser light entering modulator 43 as the light traverses modulator 43 with the amplified voltage signal provided to electrodes 53 and 55 of electro-optic modulator 43. The magnitude of the amplified voltage signal will, in turn, determine the degree of modulation of the monochromatic beam of laser light after it exits modulator 43 and is transmitted through an optical fiber 79 to a photodiode 81.

Photodiode 81 receives the modulated laser light from electro-optic modulator 43 and provides an electrical signal having an amplitude that varies in response to the degree of modulation of the laser light by electro-optic modulator 43. The electrical signal provide by photodiode 81 is supplied to a low noise amplifier 83 which amplifies the signal. The amplified electrical signal is next provided to a terminal 85 which may be connected to any conventional readout means such as an oscilloscope (not illustrated). The readout means will then provide to an observer a visual indication of the intensity of the electromagnetic field 69 which is incident upon antenna 45.

The antenna 45 used in the preferred embodiment may be relatively small, thus substantially eliminating the perturbing and scattering of incoming electromagnetic fields due to the use of metal when fabricating the antenna. For example, an electrically short dipole antenna (approximately 3 cm) may be used as antenna 45. Amplifier 49 next amplifies a relatively weak electrical signal from antenna 45 by a factor of at least 100 thus eliminating the need for a large metallic antenna which would introduce significant error into the measurements being made by electromagnetic field sensor apparatus 41.

By utilizing the combination of laser 57 and photovoltaic cell 63 to generate the DC bias voltage for amplifier 49 the need for an unreliable source of power such as a battery is eliminated. There is also a reduction in the number of metal leads, wires and other metallic elements used in the preferred embodiment of the present invention as illustrated in FIG. 2. This again reduces perturbing and scattering of incoming electromagnetic fields.

The laser source 71 used in the preferred embodiment of the present invention may be any conventional light source, but preferably is a source of monochromatic laser light having a wavelength of approximately 1.3 microns so that the monochromatic laser light may be transmitted through polarization maintaining optical fiber 77 which efficiently transmits light having a wavelength of approximately 1.3 microns. A preferred light source is a Neodymium YAG laser which operates at a wavelength of 1.32 microns and is manufactured by Schwartz Electro-Optics Inc. of Orlando, Fla.

Laser 57 may be any conventional and commercially available laser which provides monochromatic laser light having a wavelength of about 0.85 microns.

The theory of electro-optic modulation has been extensively discussed in the literature, for example F. S. Chen, "Modulators for Optical Communications", proceedings of the IEEE, Vol. 58 No. 10, October 1970, pages 1440–1457 and "Optical Waves in Crystals, Propagation and Control of Laser Radiation" by Amnon Yariv and Pochi Yeh. The literature discusses the electro-optic properties of a number of different materials and modulator configurations employing electro-optic modulators. Suitable electro-optic materials for the composition of elector-optic modulator 43 may be selected from the group consisting of crystals such as $LiNbO_3$, $LiTaO_3$, $KD_2PO_4$ (DKDP), $Ba_2NaNb_5O_{15}$, $Sr_{0.25}Ba_{0.75}Nb_2O_6$ and $BaTiO_3$.

Electro-optic modulator 43 may also be fabricated from second order nonlinear optical polymer materials, called an electro-optic polymer, which have response times in picoseconds and very low index amplitude modulation requirements of less than ten and greater than minus two. Further, the dielectric constant exhibited by these second order nonlinear optical polymers is generally less than 3.5 as opposed to conventional inorganic electro-optic materials which have dielectric constants greater than 35. Electro-optic polymers include those manufactured by Dupont and Hoest Celanese Corporation. Preferred electro-optic polymers for fabricating electro-optic modulator 43 may be, for example, methyl nitro aniline or polymethylmethacrylate. In addition, several electro-optic polymers which may be used to fabricate electro-optic modulator 43 are disclosed in U.S. Pat. No. 5,061,404, issued Oct. 29, 1991, to Chengjiu Wu et. al.

Electro-optic crystals exhibit a property identified as Pockel's linear electro-optic effect which means that the index of refraction of electro-optic materials such as lithium niobite, lithium tantalate and polymethylmethacrylate changes proportionally to the strength of an electric field being measured with this change being generally exhibited over a frequency range of from 1 hertz to 1000 GHz. The response of these materials to the electric field being measured is directly proportional to a factor known as the electro-optic coefficient which has the units of meters/volt. The electro-optic coefficient is a tensor quantity and is typically, but not always, large in the direction of one axis of the electro-optic material and weak in the remaining two axis of the material. When laser light is passed through the electro-optic material it is modulated by the changing index of refraction of the material in proportion to the strength/intensity of the electric field being measured. The laser light passing through the electro-optic material may then be measured by detector means such as photodiode 81.

These electro-optic materials also have the common property that they enter a state of variable birefringence which is proportional to the magnitude of the field strength imposed across the material. When polarized laser light propagates through the material, it undergoes a rotation in the direction of polarization which is proportional to the distance traversed in the material and the magnitude of the birefringent state. By polarizing laser light prior to entry into an electro-optic material and analyzing the polarized laser light after the light propagates through the material and undergoes a rotation of its polarization direction, by means of a polarizing analyzer apparatus, the extent of the rotation of the plane of polarization due the birefringent state can be measured. This phenomenon, known as the Pockels effect, is well known in the literature. In addition, the use of a polarizing analyzer apparatus to measure the extent of rotation of the plane of polarization after polarized laser light propagates through an electro-optic crystal is thoroughly discussed in U.S. Pat. No. 4,070,621, issued Jan. 24, 1978 to Howard I. Bassen and Richard Peterson. U.S. Pat. No. 4,070,621 also discloses signal processing circuitry which may be used with a photodetector, such as photodiode 81, and which will measure the amplitude, phase and frequency of an incident electromagnetic field.

From the foregoing, it may readily be seen that the present invention comprises a new, unique and exceedingly useful field sensor apparatus for measuring the intensity of an incoming electromagnetic field which constitutes a considerable improvement over the known prior art. Obviously many modifications and variations of the present invention are possible in light of the above teachings. It is therefore to be understood that within the scope of the appended claims the invention may be practiced otherwise than as specifically described.

What is claimed is:

1. An electromagnetic field sensor apparatus for measuring the intensity of planar electromagnetic waves comprising:

an electro-optic modulator having first surface and second surfaces intersecting a first optical path, a third surface having a first electrode attached thereto and a fourth surface having a second electrode attached thereto;

a first light source located along said first optical path for transmitting monochromatic light into said electro-optic modulator through the first surface of said electro-optic modulator;

a polarizer positioned along said first optical path below said first light source for polarizing the monochromatic light transmitted from said first light source into said electro-optic modulator;

a first optical fiber positioned along said first optical path between said polarizer and said electro-optic modulator for maintaining polarization of the monochromatic light transmitted from said first light source into said electro-optic modulator;

an antenna having an output for intercepting said planar electromagnetic waves and converting said planar electromagnetic waves intercepted to a voltage signal to be applied to the output of said antenna;

a microwave amplifier having an input coupled to the output of said antenna for receiving said voltage signal and amplifying said voltage signal by a factor of at least one hundred;

said microwave amplifier having a first output electrode connected to the first electrode of said electro-optic modulator and a second output electrode connected to the second electrode of said electro-optic modulator;

said electro-optic modulator modulating the monochromatic light entering said electro-optic modulator as the monochromatic light traverses said electro-optic modulator with said amplified voltage signal impressed upon said first and second surfaces of said electro-optic modulator;

a detector located along said first optical path downstream from said electro-optic modulator for detecting the modulated monochromatic light along said first optical path as the modulated monochromatic light exist from said electro-optic modulator whereby weak planar electromagnetic fields may be detected in free space with a negligible perturbation;

a second light source located along a second optical path for transmitting monochromatic light along said optical path; and a photovoltaic cell located along said second optical path, said photovoltaic cell having a positive terminal and a negative terminal;

said microwave amplifier having a positive terminal connected to the positive terminal of said photovoltaic cell and a negative terminal connected to the negative terminal of said photovoltaic cell;

said photovoltaic cell receiving the monochromatic light transmitted along said second optical path, converting it to a DC bias voltage and providing said DC bias voltage to said microwave amplifier via the positive and negative terminals of said microwave amplifier.

2. The electromagnetic field sensor apparatus of claim 1 wherein said antenna comprises a metallic antenna having a length of about three centimeters.

3. The electromagnetic field sensor apparatus of claim 1 further comprising a second optical fiber positioned along said first optical path below said electro-optic modulator for transmitting said modulated monochromatic light from said electro-optic modulator to said detector.

4. The electromagnetic field sensor apparatus of claim 1 further comprising a third optical fiber positioned along said second optical path between said second light source and said photovoltaic cell for transmitting the monochromatic light from said second light source to said photovoltaic cell.

5. The electromagnetic field sensor apparatus of claim 1 wherein said electro-optic modulator comprises an electro-optic crystal.

6. The electromagnetic field sensor apparatus of claim 5 wherein said crystal is composed of a material selected from the group consisting of $LiNbO_3$, $LiTaO_3$, $KD_2PO_4$(DKDP), $Ba_2NaNb_5O_{15}$, $Sr_{0.25}Ba_{0.75}Nb_2O_6$ and $BaTiO_3$.

7. The electromagnetic field sensor apparatus of claim 1 wherein said first light source is a first laser, said first laser transmitting the monochromatic light along said first optical path at a wavelength of about 1.3 microns.

8. The electromagnetic field sensor apparatus of claim 1 wherein said second light source is a second laser, said second laser transmitting the monochromatic light along said second optical path at a wavelength of about 0.85 microns.

9. The electromagnetic field sensor apparatus of claim 1 wherein said detector comprises:
a photodiode having an output; and
an amplifier having an input connected to the output of said photodiode and an output for providing an RF electrical signal indicative of the intensity of said planar electromagnetic waves intercepted by said antenna.

* * * * *